US008906159B2

(12) United States Patent
Lee

(10) Patent No.: US 8,906,159 B2

(45) Date of Patent: Dec. 9, 2014

(54) (AL, GA, IN)N-BASED COMPOUND SEMICONDUCTOR AND METHOD OF FABRICATING THE SAME

(75) Inventor: Chung Hoon Lee, Gwangmyeong-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 197 days.

(21) Appl. No.: 12/132,760

(22) Filed: Jun. 4, 2008

(65) Prior Publication Data

US 2008/0265374 A1 Oct. 30, 2008

Related U.S. Application Data

(62) Division of application No. 11/338,008, filed on Jan. 24, 2006, now abandoned.

(30) Foreign Application Priority Data

Oct. 4, 2005 (KR) ........................ 10-2005-0092871
Oct. 5, 2005 (KR) ........................ 10-2005-0093596

(51) Int. Cl.

*H01L 33/40* (2010.01)
*H01L 33/32* (2010.01)
*H01L 33/00* (2010.01)

(52) U.S. Cl.

CPC ................. *H01L 33/40* (2013.01); *H01L 33/32* (2013.01); *H01L 33/0095* (2013.01)

USPC .................. 117/86; 117/90; 117/95; 117/101

(58) Field of Classification Search

USPC ........................................ 117/86, 90, 95, 101

See application file for complete search history.

(56) References Cited

U.S. PATENT DOCUMENTS 5,306,662 A * 4/1994 Nakamura et al. ............ 438/509
5,419,785 A * 5/1995 Twigg et al. ................. 148/33.2

(Continued)

FOREIGN PATENT DOCUMENTS

JP 08-032113 2/1996
JP 08-125222 5/1996

(Continued)

OTHER PUBLICATIONS

European Search Report dated Apr. 8, 2009.

(Continued)

*Primary Examiner* — Bob M Kunemund

(74) *Attorney, Agent, or Firm* — H.C. Park & Associates, PLC

(57) ABSTRACT

Disclosed are a (Al, Ga, In)N-based compound semiconductor device and a method of fabricating the same. The (Al, Ga, In)N-based compound semiconductor device of the present invention comprises a substrate; a (Al, Ga, In)N-based compound semiconductor layer grown on the substrate; and an electrode formed of at least one material or an alloy thereof selected from the group consisting of Pt, Pd and Au on the (Al, Ga, In)N-based compound semiconductor layer. Further, the method of fabricating the (Al, Ga, In)N-based compound semiconductor device comprises the steps of growing a P layer including P type impurities in a growth chamber; discharging hydrogen and a hydrogen source gas in the growth chamber; lowering the temperature of the (Al, Ga, In)N-based compound semiconductor with the P layer formed thereon to such an extent that it can be withdrawn to the outside from the growth chamber; withdrawing the (Al, Ga, In)N-based compound semiconductor from the growth chamber; and forming an electrode of at least one material or an alloy thereof selected from the group consisting of Pt, Pd and Au on the p layer. According to the present invention, it is possible to sufficiently secure P type conductivity and obtain good ohmic contact characteristics without performing an annealing process. And, no further annealing is necessary when Pt, Pd, Au electrode are used.

8 Claims, 7 Drawing Sheets

(56) References Cited

U.S. PATENT DOCUMENTS 5,468,678 A * 11/1995 Nakamura et al. ............ 438/509
5,547,897 A * 8/1996 Taskar et al. .................. 117/103
5,563,092 A * 10/1996 Ohmi ........................... 438/485
5,578,839 A * 11/1996 Nakamura et al. .............. 257/96
5,592,501 A * 1/1997 Edmond et al. .......... 372/45.011
5,635,408 A * 6/1997 Sano et al. ...................... 438/58
5,753,933 A * 5/1998 Morimoto ....................... 257/14
5,929,466 A * 7/1999 Ohba et al. .................... 257/103
6,110,757 A * 8/2000 Udagawa ........................ 438/47
6,127,692 A * 10/2000 Sugawa et al. .................. 257/30
6,273,955 B1 * 8/2001 Yoshino et al. ............... 118/718
6,410,939 B1 6/2002 Koide et al.
6,417,020 B2 * 7/2002 Nitta et al. ...................... 438/45
6,475,882 B1 * 11/2002 Sakai et al. ................... 438/483
6,489,636 B1 * 12/2002 Goetz et al. ..................... 257/94
6,610,606 B2 * 8/2003 Sakai et al. ................... 438/712
6,630,695 B2 * 10/2003 Chen et al. .................... 257/190
6,680,957 B1 * 1/2004 Koike et al. ................ 372/43.01
6,743,702 B2 6/2004 Goto et al.
6,809,340 B2 * 10/2004 Kato et al. ...................... 257/79
6,891,268 B2 5/2005 Tomiya et al.
6,933,002 B2 * 8/2005 Tera et al. ....................... 427/66
7,135,772 B2 11/2006 Tomiya et al.
7,291,865 B2 11/2007 Kojima et al.
7,368,015 B2 5/2008 D'Evelyn et al.
7,408,182 B1 * 8/2008 Smart et al. ..................... 257/13
7,479,731 B2 * 1/2009 Udagawa ...................... 313/499
7,488,971 B2 * 2/2009 Kobayakawa et al. .......... 257/13
2002/0045286 A1 4/2002 Koide et al.
2002/0058162 A1 * 5/2002 Shibata et al. ................ 428/698
2002/0061655 A1 * 5/2002 Shibata et al. ................ 438/730
2002/0141006 A1 10/2002 Pocius et al.
2002/0146855 A1 10/2002 Goto et al.
2002/0152951 A1 10/2002 Tsvetkov et al.
2002/0155712 A1 * 10/2002 Urashima et al. ............. 438/689
2002/0170484 A1 11/2002 Katamine et al.
2004/0012011 A1 1/2004 Tomiya et al.
2004/0087050 A1 5/2004 Uemura et al.
2004/0166599 A1 * 8/2004 Ishida ............................. 438/22
2004/0209402 A1 10/2004 Chai et al.
2005/0067625 A1 * 3/2005 Hata ............................... 257/81
2005/0167693 A1 * 8/2005 Goetz et al. ................... 257/103
2005/0167835 A1 8/2005 Tomiya et al.
2005/0167836 A1 8/2005 Tomiya et al.
2005/0184300 A1 8/2005 Tazima et al.
2005/0269584 A1 * 12/2005 Hasegawa et al. .............. 257/94
2006/0017060 A1 1/2006 Chen et al.
2006/0037529 A1 2/2006 D'Evelyn et al.
2006/0048699 A1 3/2006 D'Evelyn et al.
2006/0071226 A1 4/2006 Kojima et al.
2006/0193359 A1 8/2006 Kuramoto
2006/0203868 A1 9/2006 Hirata
2006/0228820 A1 10/2006 Kerdiles et al.
2007/0012932 A1 * 1/2007 Kobayakawa et al. .......... 257/94
2007/0030872 A1 2/2007 Sato et al.
2007/0064758 A1 3/2007 Kuramoto et al.
2007/0071050 A1 3/2007 Kuramoto
2007/0074651 A1 * 4/2007 Lee ................................ 117/89
2007/0138487 A1 6/2007 Watanabe et al.
2007/0138540 A1 6/2007 Uemura et al.
2007/0141753 A1 6/2007 Uemura et al.
2007/0141806 A1 6/2007 Uemura
2007/0145396 A1 6/2007 Watanabe et al.
2007/0184591 A1 8/2007 Morizumi et al.
2008/0020502 A1 1/2008 Shiga et al.
2008/0090315 A1 4/2008 Abe et al.
2008/0265374 A1 * 10/2008 Lee .............................. 257/615
2008/0273566 A1 * 11/2008 Nishinaka et al. ....... 372/45.012
2010/0032689 A1 * 2/2010 Park et al. ....................... 257/87

FOREIGN PATENT DOCUMENTS

JP 09-129929 5/1997
JP 2001298214 10/2001
JP 2003-031845 1/2003
JP 2003046127 2/2003
JP 2005101623 4/2005
JP 2005108982 4/2005

OTHER PUBLICATIONS

Office Action dated Jul. 7, 2008 (from co-pending U.S. Appl. No. 11/338,008).

Final Office Action issued for related U.S. Appl. No. 12/502,513 dated Jan. 31, 2012.

Final Office Action dated Jun. 20, 2013 in U.S. Appl. No. 12/502,513.

Non-Final Office Action issued Mar. 14, 2013 for related U.S. Appl. No. 12/502,513.

* cited by examiner

(AL, GA, IN)N-BASED COMPOUND SEMICONDUCTOR AND METHOD OF FABRICATING THE SAME

CROSS REFERENCE TO RELATED APPLICATIONS

This application is a divisional of U.S. patent application Ser. No. 11/338,008, filed Jan. 24, 2006, which claims priority from and the benefit of Korean Patent Application No. 10-2005-0092871, filed on Oct. 4, 2005, and Korean Patent Application No. 10-2005-0093596, filed on Oct. 5, 2005, which are all hereby incorporated by reference for all purposes as if fully set forth herein.

BACKGROUND OF THE INVENTION

1. Field of the Invention

The present invention relates to Aluminum (Al), Gallium (GA), Indium (In) N-based compound semiconductor device and a method of fabricating the same, and more particularly to a (Al, Ga, In)N-based compound semiconductor device comprising a (Al, Ga, In)N-based compound semiconductor layer (P layer) including P type impurities and a transparent electrode provided on the P layer, and a method of fabricating the (Al, Ga, In) N-based compound semiconductor device.

2. Discussion of the Background

A (Al, Ga, In)N-based compound semiconductor is applied, for example, to a compound semiconductor device such as a light emitting diode (LED) or a laser diode (LD). FIG. 1 is a cross-sectional view schematically showing a conventional (Al, Ga, In)N-based compound semiconductor device.

Referring to FIG. 1, a (Al, Ga, In)N-based compound semiconductor layer (N layer) 13 including N type impurities, an active layer 15 and a (Al, Ga, In)N-based compound semiconductor layer (P layer) 17 including P type impurities are sequentially formed on a substrate 11. The P layer 17, the active layer 15 and the N layer 13 are partially etched such that the N layer 13 is partially exposed to the outside. Electrodes 19 and 21 including Ni and Au are formed on the P layer 17, and an electrode 25 is also formed on the N layer 13.

Generally, impurities are doped in the P layer 17 to secure the conductivity in the conventional (Al, Ga, In)N-based compound semiconductor device 101. However, the P type impurities, e.g., magnesium (Mg), do not fulfill the function as an electron acceptor that provides free holes, since they are easily bonded with hydrogen (H) existing in a growth chamber. Therefore, an additional annealing process of disconnecting bonds between the P type impurities and hydrogen is performed in a process of fabricating a P layer of a (Al, Ga, In)N-based compound semiconductor.

FIG. 2 is a flowchart illustrating a method of fabricating a P layer of a conventional (Al, Ga, In)N-based compound semiconductor.

Referring to FIG. 2, P type impurities and source gases for the compound semiconductor are supplied to a growth chamber such that a P layer of the compound semiconductor is grown on a substrate (P1). After the full growth of the P layer, the growth chamber is cooled to lower the temperature of the substrate (P2). Thereafter, the P layer-grown substrate is withdrawn from the growth chamber (P3). Then, annealing is performed for the P layer (P4). Referring to U.S. Pat. No. 5,306,662, a P layer of a compound semiconductor is grown using P type impurities and source gases for the compound semiconductor and the P layer is subsequently annealed at a temperature of 400° C. or more. As a result, hydrogen bonded to the P type impurities is removed to form a P type (Al, Ga, In)N-based compound semiconductor with low and uniform resistance.

Meanwhile, an annealing process is also performed to obtain ohmic contact characteristics between the P layer and a metallic electrode. With the annealing process, there are advantages in that good ohmic contact characteristics between the electrode and the P layer is obtained, and bonds between the P type impurities and hydrogen remaining in the P layer are disconnected.

In such a conventional (Al, Ga, In)N-based compound semiconductor device, at least one annealing process should be performed to lower the resistance of the P layer or improve ohmic contact characteristics between the P layer and a transparent electrode. However, the annealing process has a problem in that it makes a fabrication process of a compound semiconductor device complicated and troublesome. The annealing process prolongs fabrication time of a product and particularly increases the unit cost of a product since expensive equipment for performing the annealing process should be purchased, and a space for installing the equipment is required, resulting in increases of investment costs for fabrication facilities.

SUMMARY OF THE INVENTION

The present invention is conceived to solve the aforementioned problems in the prior art. An object of the present invention is to provide a (Al, Ga, In)N-based compound semiconductor device that exhibits superior performance without performing a conventional annealing process, and a method of fabricating the (Al, Ga, In)N-based compound semiconductor device.

Another object of the present invention is to provide a (Al, Ga, In)N-based compound semiconductor device capable of securing P type conductivity without a conventional P layer annealing process, and a method of fabricating the (Al, Ga, In)N-based compound semiconductor device.

A further object of the present invention is to provide a method of fabricating a P layer of a (Al, Ga, In)N-based compound semiconductor, wherein P type conductivity can be secured without a conventional annealing process.

A still further object of the present invention is to provide a (Al, Ga, In) N-based compound semiconductor device capable of securing ohmic characteristics between a P layer and an electrode without an annealing process after forming the electrode.

A still further object of the present invention is to provide a (Al, Ga, In)N-based compound semiconductor device that can be fabricated simply and conveniently without performing an annealing process, thereby reducing facility investment, and a method of fabricating the (Al, Ga, In)N-based compound semiconductor device.

According to an aspect of the present invention for achieving the objects, there is provided a (Al, Ga, In)N-based compound semiconductor device, comprising a substrate; a (Al, Ga, In)N-based compound semiconductor layer grown on the substrate; and an electrode formed of at least one material selected from the group consisting of Pt, Pd and Au or an alloy thereof on the (Al, Ga, In)N-based compound semiconductor layer.

In this instance, the electrode may be formed by stacking Pt and Au, or Pd and Au; or formed of an alloy of at least two selected from Pt, Pd and Au.

According to another aspect of the present invention for achieving the objects, there is provided a method of fabricating a (Al, Ga, In)N-based compound semiconductor device, comprising the steps of growing a (Al, Ga, In) N-based compound semiconductor layer (P layer) including P type impurities on a substrate in a growth chamber; discharging hydrogen, ammonia and gas including hydrogen in the growth chamber; lowering the temperature of the substrate with the P layer formed thereon to such an extent that the substrate can be withdrawn to the outside from the growth chamber; withdrawing the substrate with the P layer formed thereon from the growth chamber; and forming an electrode of at least one material selected from the group consisting of Pt, Pd and Au on the P layer or an alloy thereof.

Here, the step of lowering the temperature may be performed by means of water cooling or air cooling of the growth chamber.

Meanwhile, the step of lowering the temperature may comprise the steps of maintaining the growth chamber under vacuum conditions; and supplying a cooling gas into the growth chamber under vacuum conditions.

A method of fabricating a P layer of a (Al, Ga, In)N-based compound semiconductor according to a further aspect of the present invention comprises the steps of growing the P layer by supplying gases into a growth chamber while maintaining temperature of the growth chamber at a temperature for growth of the P layer of the (Al, Ga, In)N-based compound semiconductor; stopping the supply of the gases after the growth of the P layer is completed; discharging the gases existing in the growth chamber at a temperature higher than a temperature at which impurities in the P layer and hydrogen contained in the gases are bonded to each other; and lowering the temperature of the P layer of the (Al, Ga, In)N-based compound semiconductor.

The temperature for the growth of the P layer may be in a range of 600 to 1,300° C., and the temperature at which the gases existing in the growth chamber are discharged may be in a range of 400 to 1,300° C.

According to the present invention, there are provided a (Al, Ga, In)N-based compound semiconductor device and a method of fabricating the same, wherein P type conductivity can be sufficiently secured and good ohmic contact characteristics can be obtained without performing a conventional annealing process. And, according to the present invention, there are provided a P layer of a (Al, Ga, In)N-based compound semiconductor and a method of fabricating the same, wherein P type conductivity can be sufficiently secured without performing a conventional annealing process. Furthermore, no further annealing is necessary when Pt, Pd or Au or alloy electrode thereof is used. As such, the present invention enables simple and convenient fabrication of the (Al, Ga, In)N-based compound semiconductor device, and reduction in facility investment by eliminating such a conventional annealing process.

DETAILED DESCRIPTION OF THE ILLUSTRATED EMBODIMENTS

Hereinafter, a (Al, Ga, In)N-based compound semiconductor and a method of fabricating the same will be described in detail according to the present invention with reference to the accompanying drawings.

Figure 1:
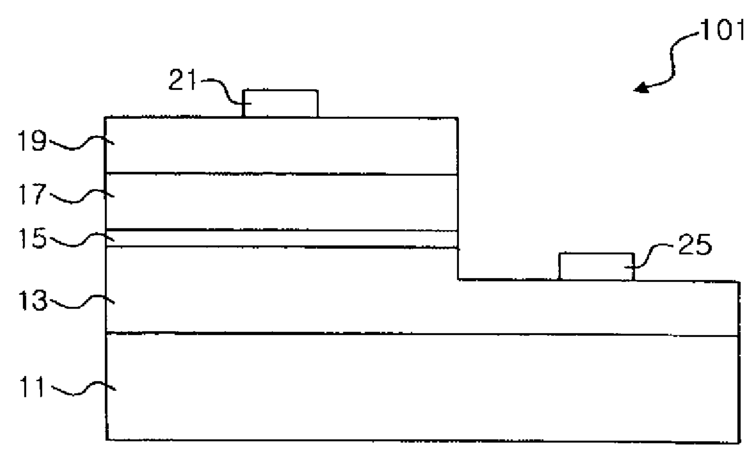
FIG. 1 is a schematic cross-sectional view of a conventional (Al, Ga, In)N-based compound semiconductor.
Figure 2:
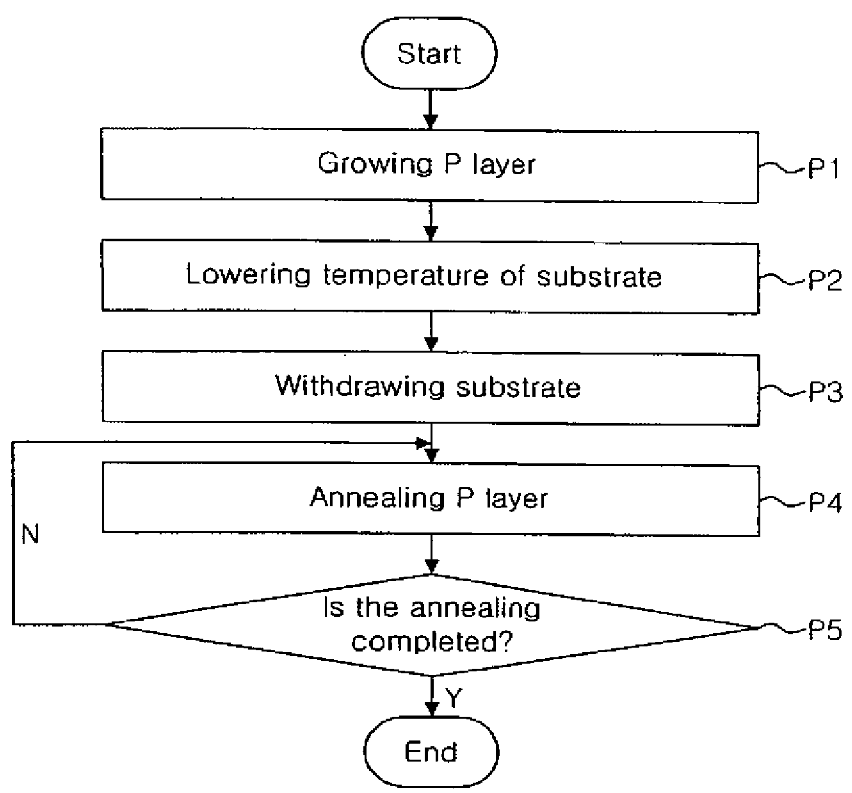
FIG. 2 is a flowchart illustrating a conventional method of fabricating a P layer of a (Al, Ga, In)N-based compound semiconductor.
Figure 3:
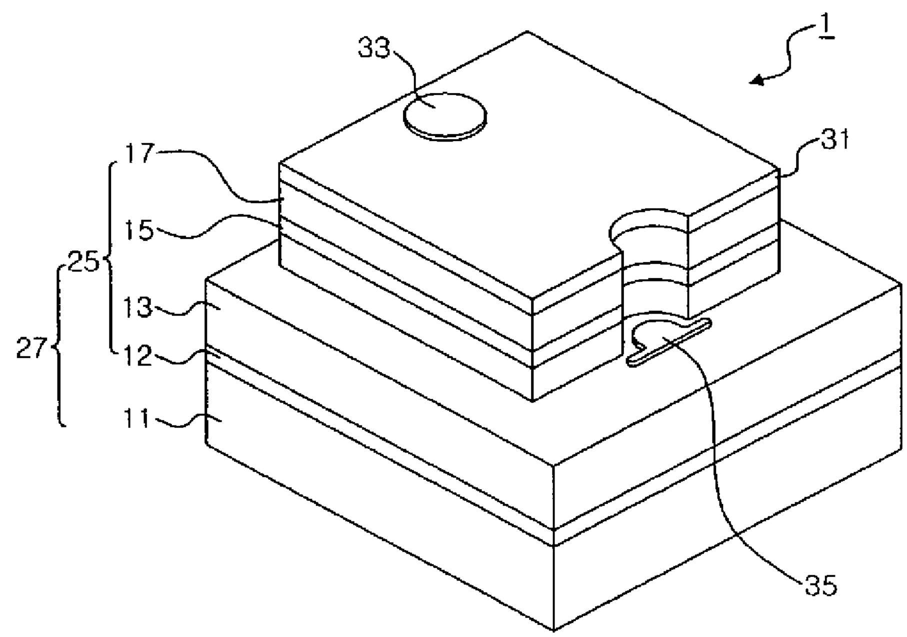
FIG. 3 is a perspective view of a (Al, Ga, In)N-based compound semiconductor device comprising a P Layer and an electrode according to an embodiment of the present invention.
Figure 4:
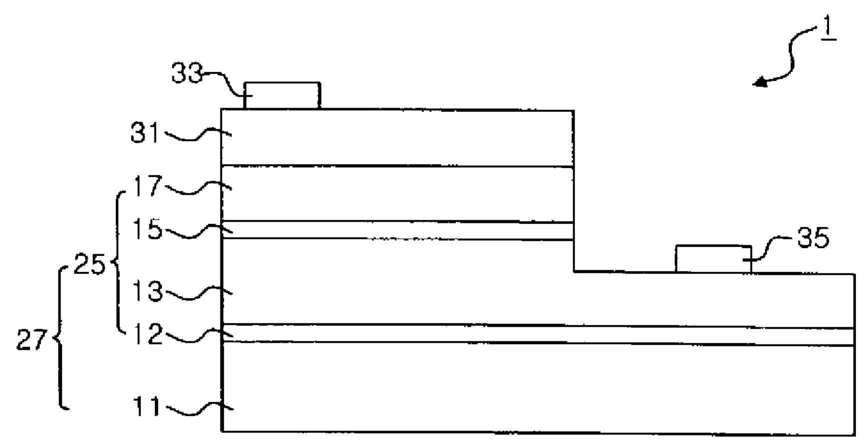
FIG. 4 is a cross-sectional view of FIG. 3.

FIG. 3 is a perspective view of a (Al, Ga, In)N-based compound semiconductor device comprising a P layer and an electrode according to an embodiment of the present invention, and FIG. 4 is a cross-sectional view of FIG. 3. The (Al, Ga, In)N-based compound semiconductor device 1 comprises a substrate 11, (Al, Ga, In)N-based compound semiconductor layers 25 grown on the substrate 11, and electrodes 31 and 35 formed on the (Al, Ga, In)N-based compound semiconductor layers 25. Meanwhile, an electrode pad 33 for electrical connection with the outside may be formed on the electrode 31.

Insulative sapphire or others may be used as the substrate 11, and a conductive or semi-conductive substrate of Si, SiC, GaN or the like may also be used as the substrate 11. Recently, the conductive or semi-conductive substrate is frequently used in a (Al, Ga, In)N-based compound semiconductor device for high power since it is relatively superior to a sapphire substrate in view of thermal conductivity.

The (Al, Ga, In)N-based compound semiconductor layers 25 comprise a buffer layer 12, a (Al, Ga, In)N-based compound semiconductor layer doped with N type impurities (N layer) 13, a (Al, Ga, In)N-based compound semiconductor layer doped with P type impurities (P layer) 17, and an active layer 15 interposed between the N layer and the P layer. The buffer layer 12 is formed to have a certain thickness on the substrate 11 to relieve lattice mismatch between the substrate 11 and the N layer 13. The buffer layer 12 maybe formed of AlN, InGaN, GaN, AlGaN, or the like.

Although the N layer 13 may be formed without doping of impurities, it is desirable to form the N layer by doping impurities of Si, Ge, Se, S, Te or the like. For example, the N layer 13 that may be fabricated to have a thickness of 0.5 to 10 μm is preferably formed of GaN. The N layer 13 may be formed to have a structure in which GaN layers with impurities and GaN layers without impurities are alternately stacked one above the other. The number of stacked layers can be properly selected.

The active layer 15 can be constructed to have a quantum well (QW) structure, for example, a single quantum well (SQW) structure or a multi quantum well (MQW) structure. The quantum well structure may contain stacks of (Al, Ga, In)N-based semiconductor layers, for example, InGaN layers and GaN layers. Power output is expected to vary depending on the number of stacked layers or the thicknesses of the InGaN and GaN layers. Therefore, it is important to properly set the number of stacked layers and thicknesses thereof.

Figure 5:
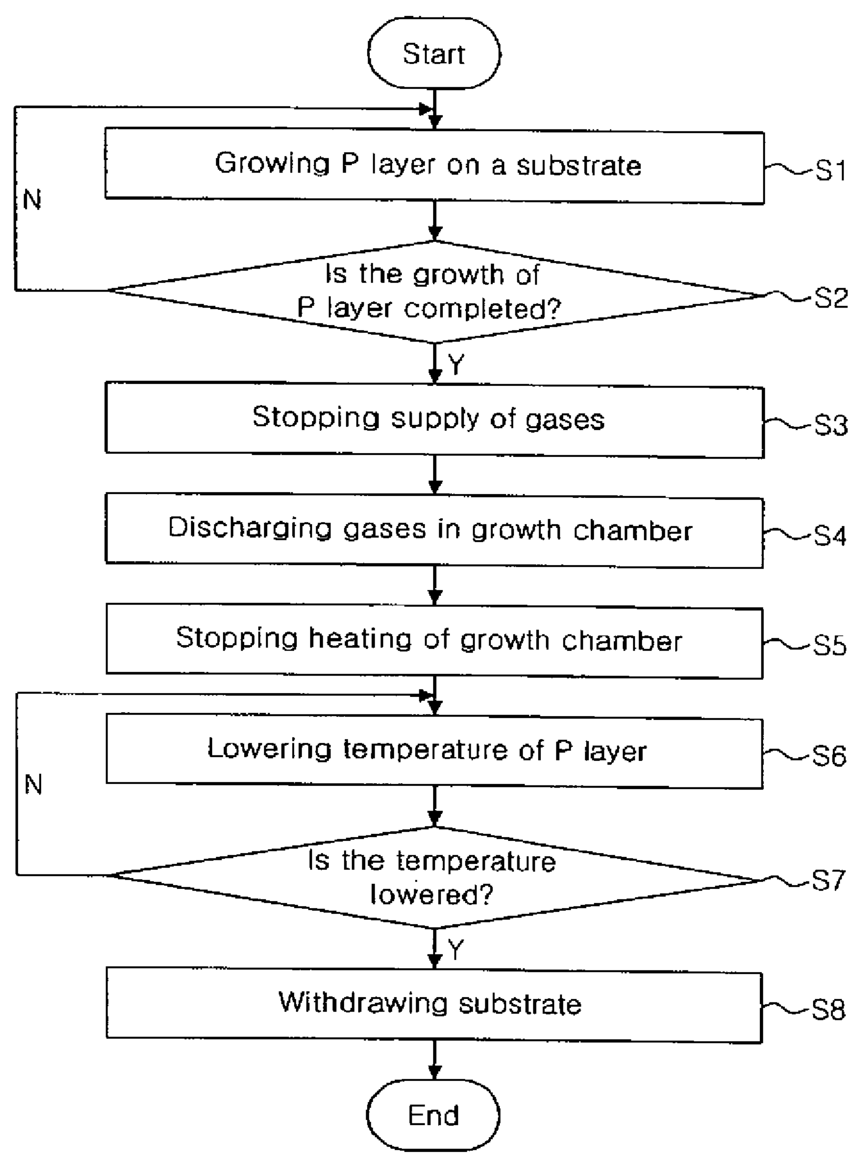
FIG. 5 is a flowchart illustrating a method of fabricating a P layer of a (Al, Ga, In)N-based compound semiconductor according to an embodiment of the present invention.
Figure 6:
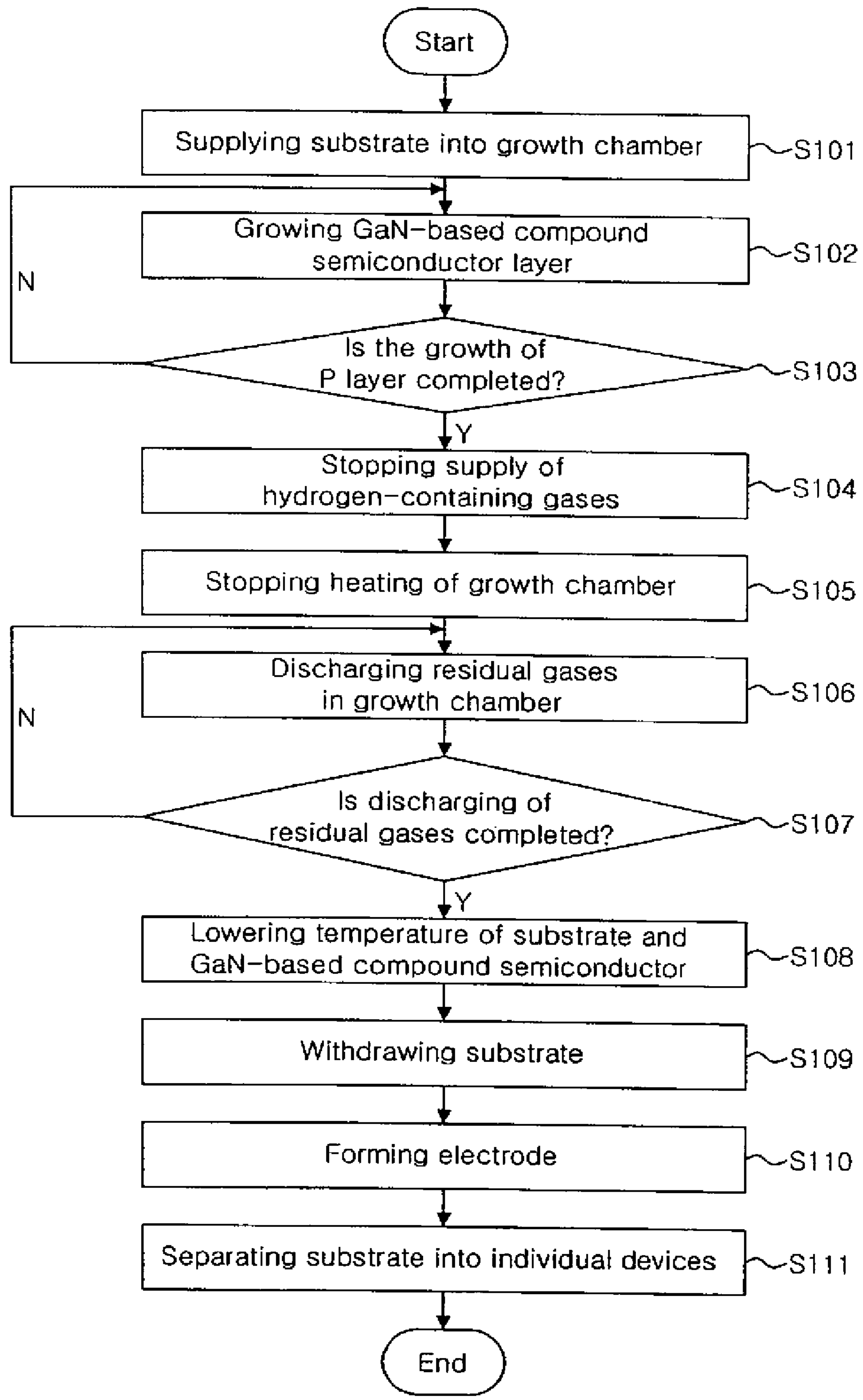
FIG. 6 is a flowchart illustrating a method of fabricating a (Al, Ga, In)N-based compound semiconductor according to an embodiment of the present invention.

The P layer 17 is formed by means of doping of P type impurities. Be, Sr, Ba, Zn or Mg may be used as the P type impurities, but Mg is often used. Although a detailed description will be made later with reference to FIGS. 5 and 6 illustrating fabrication methods in the present invention, a phenomenon in which bonding of the impurities with hydrogen is generated in the P layer 17 is prevented in advance, so that the impurities themselves can contribute to generation of free holes.

Meanwhile, the P layer 17, the active layer 15 and the N layer 13 are partially etched in the (Al, Ga, In) N-based compound semiconductor layers 25 grown on the substrate 11, so that a portion of the N layer 13 is exposed to the outside. A thin electrode 31 formed on the P layer 17, and an electrode 35 is also formed on the N layer 13. It is desirable to form the electrode 31 on the P layer 17 as a transparent electrode capable of transmitting light generated from the active layer 15 therethrough.

The electrode 31 on the P layer 17 is formed of at least one material selected from the group consisting of Pt, Pd and Au or an alloy thereof. For example, the electrode may be formed of N and Au, or Pd and Au by sequentially stacking Pt and Au on the P layer 17 or Pd and Au on the P layer 17. Here, the stacking sequence of Pt and Au, or Pd and Au may be selective. The electrode 31 may be formed of an alloy of at least two selected from the group consisting of Pt, Pd and Au. In case where the electrode 31 is formed of such a metallic material, good ohmic contact characteristics can be obtained without performing an additional annealing process.

An electrode pad 33 is formed on a portion of the electrode 31, which is to be electrically connected to the outside. The electrode pad 33 may also be formed of a metallic material with the same components as the electrode of the present invention.

Meanwhile, the electrode 35 formed on the N layer 13 may also be formed of the same metallic material as the electrodes 31 and 33 formed on the P layer 17. However, a material with different components may be used for the electrode in consideration of properties of the N layer 13. Since a variety of techniques regarding the N layer electrode 35 and components thereof is known, detailed descriptions thereof will be omitted.

Hereinafter, a method of fabricating the (Al, Ga, In)N-based compound semiconductor described as a preferred embodiment of the present invention will be explained.

FIG. 5 is a flowchart illustrating a method of fabricating the P layer of the (Al, Ga, In)N-based compound semiconductor according to the present invention.

Referring to FIG. 5, although not illustrated in the flowchart, the P layer 17 of the (Al, Ga, In)N-based compound semiconductor device 1 is formed after supplying the substrate 11 into a growth chamber, heating the substrate therein and sequentially growing the buffer layer 12, the N layer 13 and the active layer 15 on the heated substrate (S1).

The P layer 17 is grown by supplying source gases into the growth chamber at a high temperature of 600° C. or more after forming the active layer 15 (S1). As for the source gases, for example, tri-methyl gallium (TMG) may be used as a source of Ga, and ammonia ($NH_3$) may be used as a source of nitrogen (N), and the source gases are supplied together with a carrier gas of $H_2$ or $N_2$. Meanwhile, in a case where Mg is doped as P type impurities, $Cp_2Mg$ may be used as a source. If the growth of the P layer 17 is completed (S2), the supply of the gases (including the source gases and the carrier gas) into the growth chamber is stopped (S3), and all the gases existing in the growth chamber are discharged (S4).

An important technical feature of the present invention is to provide a state and a condition under which the P type impurities and hydrogen cannot be bonded to each other in the growth chamber. Epitaxial growth is made in the growth chamber at a high temperature at which the P type impurities and hydrogen cannot be bonded to each other, for example, at 600~700° C. or more. In the present invention, the P layer 17 is formed at a very high temperature, for example, at 600 to 1,300° C., wherein the P type impurities and hydrogen are not bonded to each other at the P layer-forming temperature of the present invention. As described above, after the growth of the P layer is completed at a very high temperature, the external supply of the gases into the growth chamber is stopped, and residual gases in the growth chamber are discharged to the outside. Since hydrogen does not exist in the growth chamber, bonding of the P type impurities with hydrogen does not occur, and the impurities in the P Layer are in a state where they can perform the function of an electron acceptor to provide free holes. Since bonding of the P type impurities with hydrogen does not occur, it is not necessary to perform an annealing process in the present invention.

After the gases in the growth chamber have been completely discharged (S4), the heating is stopped (S5) so that the temperature of the substrate 11 and the temperature of the (Al, Ga, In)N-based compound semiconductor layers 25 formed thereon are lowered in the growth chamber (S6). Here, the temperatures of the substrate 11 and the (Al, Ga, In)N-based compound semiconductor layers 25 may be lowered by means of air cooling or water cooling of the growth chamber. The temperatures of the substrate 11 and the (Al, Ga, In)N-based compound semiconductor layers 25 may also be lowered by injecting a cooling gas into the growth chamber in the state where hydrogen and hydrogen source gases have been discharged from the growth chamber. A gas that is difficult to be bonded to the P type impurities, e.g., nitrogen ($N_2$) gas is preferably used as the cooling gas since the nitrogen gas is also used as the carrier gas. The temperatures of the substrate 11 and the (Al, Ga, In)N-based compound semiconductor layers 25 can be lowered more rapidly by injecting the cooling gas into the growth chamber after maintaining the growth chamber under vacuum conditions.

If the temperatures of the substrate 11 and the (Al, Ga, In)N-based compound semiconductor layers 25 are sufficiently lowered (S7), the substrate 11 is withdrawn from the growth chamber (S8). Since bonding of the impurities with hydrogen does not occur in the P layer, it is not necessary to perform an additional annealing process. In this case, since the impurities themselves of the P layer can contribute to generation of free holes, a superior P layer with low resistance is provided and enables fabrication of a product with excellent properties.

Figure 7:
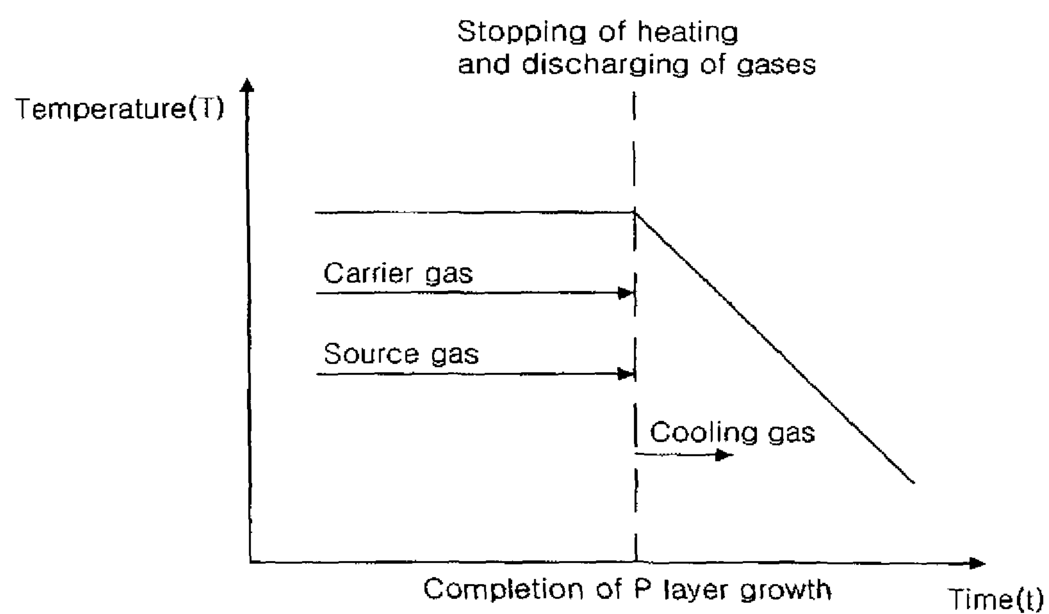
FIG. 7 is a graph schematically illustrating the method of fabricating the P layer of the (Al, Ga, In) N-based compound semiconductor according to the present invention.

FIG. 6 is a flowchart illustrating a method of fabricating the (Al, Ga, In)N-based compound semiconductor device according to an embodiment of the present invention, and FIG. 7 is a graph schematically illustrating a method of fabricating the P layer according to an embodiment of the present invention.

Referring to FIGS. 6 and 7, the substrate 11 is first supplied into the growth chamber in order to grow the (Al, Ga, In)N-based compound semiconductor layers 25 (S101). After heating the substrate 11 to a predetermined temperature, the (Al, Ga, In)N-based compound semiconductor layers 25, e.g., the buffer layer 12, the N layer 13, the active layer 15 and the P layer 17, are sequentially grown on the substrate (S102). Hereinafter, for the sake of convenience of explanation and understanding of the fabrication method of the present invention, "the substrate 11 and the (Al, Ga, In)N-based compound semiconductor layers 25 grown thereon" will be simply referred to as "Epi 27."

Most of techniques regarding the growth of the Epi 27 can be easily understood by those skilled in the art and are well known to the public. However, the thicknesses of the buffer layer 12, the N layer 13, the active layer 15 and the P layer 17, growth conditions thereof, i.e., temperature and pressure, and techniques applied to or in-between the respective layers 12, 13, 15 are particularly important. A specific description of an epitaxial growth technology that is not greatly related to the present invention will be omitted. The (Al, Ga, In)N-based compound semiconductor layers 25, except the P layer 17, mentioned in the embodiment of the present invention can be grown through an ordinary technique that is easily understood by those skilled in the art.

When the growth of the (Al, Ga, In)N-based compound semiconductor layers 25 on the substrate 11 is completed (S103), i.e., after the P layer 17 has been formed, the supply of gases containing hydrogen is stopped (S104). At the same time, the supply of other gases into the growth chamber may also be stopped. Here, the gases supplied into the growth chamber include source gases such as $NH_3$ and TMG and a carrier gas such as $H_2$ or $N_2$. After the supply of the gases into the growth chamber is stopped, heating of the growth chamber may also be stopped (S105). Stopping the heating of the growth chamber (S105) may be performed preferentially to or simultaneously with stopping the supply of the gases into the growth chamber (S104). After stopping the heating of the growth chamber and the supply of the gases into the growth chamber (S104, S105), residual gases in the growth chamber, particularly, hydrogen and hydrogen source gases are discharged to the outside of the growth chamber (S106). Meanwhile, stopping the heating of the growth chamber (S105) may be performed after the hydrogen and hydrogen source gases in the growth chamber are discharged to the outside of the growth chamber.

As described with reference to FIG. 5, an important technical feature of the present invention is to provide a state and a condition under which the P type impurities and hydrogen cannot be bonded to each other in the growth chamber. After the growth of the P layer is completed at a high temperature at which the P type impurities and hydrogen cannot be bonded to each other, the external supply of the gases into the growth chamber is stopped (S104), and residual gases in the growth chamber are discharged to the outside of the growth chamber (S106). In this case, since hydrogen does not exist in the growth chamber, bonding of the P type impurities with hydrogen cannot occur. Therefore, it is not necessary to perform a conventional annealing process for removing hydrogen from the P layer.

After all the residual gases in the growth chamber have been discharged to the outside (S107), the temperature of the Epi 27 is lowered to such an extent that the Epi 27 can be withdrawn to the outside from the growth chamber (S108). After stopping the heating in the growth chamber, the temperature of the Epi 27 may be lowered by leaving the Epi 27 such that it is cooled through natural convection. The temperature of the Epi 27 may be lowered by means of air cooling or water cooling of the growth chamber. Alternatively, the temperature of the Epi 27 may be lowered by injecting a cooling gas such as nitrogen ($N_2$) gas, which is not bonded to impurities, into the growth chamber after completely discharging the gases remaining in the growth chamber or maintaining the growth chamber under vacuum conditions. The temperature of the Epi 27 may be lowered more rapidly by injecting the cooling gas into the growth chamber after maintaining the growth chamber under vacuum conditions.

If the temperature of the Epi 27 is sufficiently lowered, the Epi 27 is withdrawn from the growth chamber (S109). After the Epi 27 is withdrawn, a portion of the N layer 13 is exposed by partially etching the P layer 17, the active layer 15 and the N layer 13. Then, the electrode 31 is formed on a top surface of the partially etched Epi 27, i.e., a top surface of the P layer 17 (S110). As described above with reference to FIGS. 3 and 4, the electrode 31 is formed as a metallic transparent electrode out of at least one material selected from the group consisting of Pt, Pd and Au. In this case, good ohmic contact characteristics can be obtained without an additional annealing process.

The electrode 35 is formed on the N layer 13 simultaneously or sequentially with the formation of the electrode 31 on the P layer 17. The P layer electrode 31 and the N layer electrode 35 are spaced apart at a certain distance. After the formation of the electrode 31 on the P layer 17, the electrode pad 33 electrically connected to the outside is formed on the electrode 31. Then, the Epi 27 is separated to obtain an individual device including the pair of electrodes 33 and 35 (S111).

When a (Al, Ga, In)N-based compound semiconductor device is fabricated according to the method, a P layer 17 with low resistance can be formed and good ohmic contact characteristics can be secured without performing an additional annealing process. Therefore, annealing equipment is not required, a fabrication process is simplified, and a product can be fabricated very easily.

Figure 8:
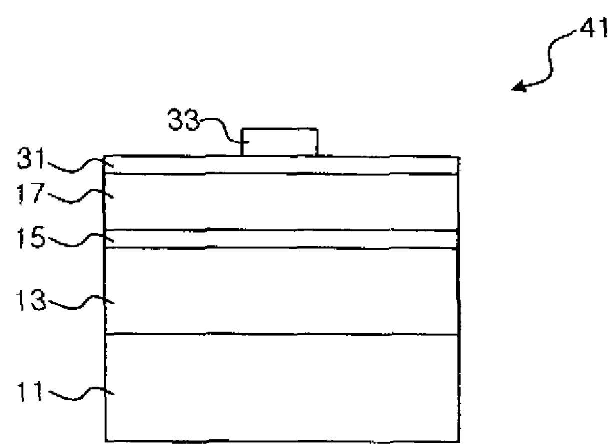
FIG. 8 is a cross-sectional view showing a compound semiconductor device according to another embodiment of the present invention.

FIG. 8 is a cross-sectional view illustrating a (Al, Ga, In)N-based compound semiconductor device with a P layer according to another embodiment of the present invention. In the (Al, Ga, In)N-based compound semiconductor device 41 of this embodiment of the present invention, an N layer 13, and active layer 15 and a P layer 17 are formed on a substrate 11, and a P type electrode 31 is formed on a top surface of the P layer 17. The substrate 11 is formed of a conductive or semi-conductive material such as metal, Si, SiC or GaN, and the substrate itself functions as an N type electrode. The substrate 11 may also be formed of Sapphire or Spinel. Electrode pads electrically connected to the outside may be formed on a top surface of the P type electrode 31 and/or a bottom surface of the substrate 11. A buffer layer (12 in FIGS. 3 and 4) may be formed between the N layer 13 and the substrate 11 in the same manner as the aforementioned embodiment.

In this embodiment of the present invention, the P layer 17 is formed without an annealing process as described above with reference to FIG. 5 or 6. After the formation of the P layer 17, an electrode is formed thereon out of at least one metallic material selected from the group consisting of Pt, Pd and Au.

Meanwhile, although the embodiment in which the substrate 11 is disposed adjacent to the N layer 13 is illustrated in FIG. 8, the present invention is not limited thereto but may be applied to a structure in which the substrate is disposed adjacent to the P layer. This structure also provides the same functions and effects as the embodiments described and illustrated above.

It is apparent that a (Al, Ga, In)N-based compound semiconductor explained herein in connection with the present invention comprises $Al_xIn_yGa_zN$ ($0 \le x$, y, $z \le 1$) and can be applied to, for example, a variety of fields in addition to a light emitting diode (LED), a laser diode (LD), heterojunction bipolar transistor, field effect transistor, or photodectector.

What is claimed is:

1. A method of fabricating a (Al, Ga, In)N-based compound semiconductor device, comprising:

growing a (Al, Ga, In)N-based compound semiconductor layer (P layer) including P type impurities on a substrate in a growth chamber including hydrogen carrier gas along with source gases including ammonia gas;

discharging hydrogen, ammonia and gas including hydrogen from the growth chamber at a temperature higher than a temperature at which impurities in the P layer and hydrogen contained in the gases are bonded to each other after the growth of the P layer is completed;

after the discharging of the hydrogen, ammonia and gas including hydrogen, lowering the temperature of the substrate with the P layer formed thereon to such an extent that the substrate can be withdrawn to the outside from the growth chamber;

withdrawing the substrate with the P layer formed thereon from the growth chamber; and forming an electrode on the P layer, the electrode comprising Pt, or a combination of Pt and at least one of Pd and Au, or an alloy of Pt and at least one of Pd and Au, wherein the grown P layer is not subjected to an annealing process.

2. The method as claimed in claim 1, wherein lowering the temperature is performed by means of water cooling or air cooling of the growth chamber.

3. The method as claimed in claim 1, wherein lowering the temperature comprises:

maintaining the growth chamber under vacuum conditions; and supplying a cooling gas into the growth chamber under vacuum conditions.

4. A method of fabricating a P layer of a (Al, Ga, In)N-based compound semiconductor, comprising:

growing the P layer by supplying a carrier gas including hydrogen along with source gases including ammonia gas into a growth chamber while maintaining temperature in the growth chamber at a temperature for growth of the P layer of the (Al, Ga, In)N-based compound semiconductor;

stopping the supply of the carrier gas and source gases after the growth of the P layer is completed;

discharging the gases existing in the growth chamber at a temperature higher than a temperature at which impurities in the P layer and hydrogen contained in the gases are bonded to each other;

lowering the temperature of the P layer of the (Al, Ga, In)N-based compound semiconductor;

withdrawing the substrate with the P layer formed thereon from the growth chamber; and forming an electrode on the P layer, the electrode comprising Pt, or a combination of Pt and at least one of Pd and Au, or an alloy of Pt and at least one of Pd and Au, wherein the grown P layer is not subjected to an annealing process.

5. The method as claimed in claim 4, wherein the temperature of the P layer is lowered by means of air cooling or water cooling.

6. The method as claimed in claim 4, wherein lowering the temperature of the P layer comprises:

maintaining the growth chamber under vacuum conditions; and supplying a cooling gas into the growth chamber under vacuum conditions.

7. The method as claimed in claim 4, wherein the temperature for the growth of the P layer is in a range of 600 to 1,300° C.

8. The method as claimed in claim 4, wherein the temperature at which the gases existing in the growth chamber are discharged is in a range of 400 to 1,300° C.

* * * * *